United States Patent [19]
Fritzsche et al.

[11] Patent Number: 5,597,411
[45] Date of Patent: Jan. 28, 1997

[54] METHOD OF FORMING A SINGLE CRYSTAL MATERIAL

[75] Inventors: Helmut Fritzsche, Chicago, Ill.; Stanford R. Ovshinsky, Bloomfield Hills; Rosa Young, Troy, both of Mich.

[73] Assignee: Energy Conversion Devices, Inc., Troy, Mich.

[21] Appl. No.: 656,697

[22] Filed: Feb. 19, 1991

[51] Int. Cl.⁶ .................................................. C30B 25/04
[52] U.S. Cl. .............................. 117/104; 117/84; 117/937; 505/819
[58] Field of Search ..................................... 156/603, 610, 156/613, 614; 505/1, 729, 732, 734, 780, 781, 819; 427/53.1, 54.1

[56] References Cited

U.S. PATENT DOCUMENTS 3,585,088  6/1971  Schwuttke et al. ................ 156/603

FOREIGN PATENT DOCUMENTS

| 0309956 | 12/1989 | Japan | 505/729 |
| 0070061 | 3/1990 | Japan | 505/734 |
| 2196099 | 8/1990 | Japan | 505/729 |

OTHER PUBLICATIONS

"Mass–Spectrometer Controlled Coevaporation of Y–Ba–Cu–O Thin Films on Alumina–Substrates", Hudner; *Journal of Crystal Growth* 91 (1988) pp. 368–372.

*Primary Examiner*—R. Bruce Breneman
*Assistant Examiner*—Felisa Garrett
*Attorney, Agent, or Firm*—David W. Schumaker; Marvin S. Siskind; Marc J. Luddy

[57] ABSTRACT

A method of growing an epitaxial like, single crystal, superconducting film by promoting the epitaxial-like growth of film from a single nucleation site in deference to substantially all other nucleation sites on the substrate. The present invention contemplates the use of a mask to systematically expose sections of the substrate to the deposition apparatus. This mask may include an adjustable or fixed aperture and is manipulated as herein described to systematically expose areas of the substrate to the deposition apparatus.

34 Claims, 2 Drawing Sheets

METHOD OF FORMING A SINGLE CRYSTAL MATERIAL

FIELD OF THE INVENTION

The present invention relates generally to electronic materials, and more particularly to a method and apparatus for forming thin, single crystal films of a variety of useful materials by a process of "epitaxial-like" growth. Utilizing the technique described herein, it is possible to deposit large area "epitaxial-like," single crystal superconducting films on relatively inexpensive substrates for high current and other device applications. Similarly, high quality semiconductor bodies or substrate materials may be prepared by the herein disclosed techniques.

BACKGROUND OF THE INVENTION

The attainment of high-temperature superconductivity with a new class of superconducting materials is of immense scientific and technological importance. Many members of this new class of superconducting materials belong to the family of ceramics called "perovskites." Typically, perovskites are described by the general formula $ABX_3$ and consist of cubes made up of three distinct elements which are present in a 1:1:3 ratio. The perovskite structure is similar to the naturally occurring calcium titanate structure, $CaTiO_3$, characterized by at least one cation much larger than the other cation or cations.

In late 1986, the superconducting properties of certain ceramic defect oxide type materials, which materials are variations of the typical perovskite class of inorganic structures, were observed by Bednorz and Mueller. The Bednorz and Mueller work was based upon materials developed by Michel and Raveau. The materials which Bednorz and Mueller observed contained lanthanum, barium, copper, and oxygen, and were reported to be superconducting at a temperature of about 30 degrees Kelvin. Continued work in the field resulted in the increase of the critical temperature, $T_c$ (the temperature at which electrons or holes are able to move through a material without encountering any resistance to that motion), by the substitution of yttrium for lanthanum. Upon analysis, the superconducting composition was found to be a perovskite ceramic defect oxide of the $Y_1Ba_2Cu_3O_7$ type, an orthorombically distorted perovskite. Further work with this phase effectively raised the critical temperature to a few degrees above 90 degrees Kelvin (a temperature above the atmospheric boiling point of liquid nitrogen).

Other perovskite phase materials have a recurring crystallographic unit cell structure including substantially parallel a and b planes spatially disposed along and substantially parallel to the c-axis thereof. These other perovskite phase materials include many compositional variations over the basic $ABX_3$ formula. Such compounds as magnesium-iron silicate, calcium uranium oxide, $Ca_2FeTiO_y$, and $Bi_2Sr_2Ca_2Cu_3O_y$ are further examples of perovskite phase materials.

The superconducting perovskite type materials are ceramic based defect oxides. That is, the superconducting phases of the perovskite type materials are solids in which different kinds of atoms occupy structurally equivalent sites, and where, in order to preserve electrical neutrally, some sites are unoccupied, or vacant. Since these vacancies may be filled with mobile oxygen atoms, only local order is prevalent with periodicity existing along the planes. These vacant sites form lattice defects, which defects have, generally, profound effects upon the electrical parameters of the superconducting material and more particularly upon the oxidation states of the copper atoms in the unit cells thereof.

Heretofore, single crystal superconducting perovskite type films could only be grown on a "template," i.e., an underlying substrate characterized by substantially the identical crystallographic lattice structure as that of the superconducting film. The superconducting film deposited on this "template" can thereby be epitaxially grown according to the lattice structure of the substrate. Materials, such as strontium titanate and lanthanum aluminate, which have lattice structures matched to the lattice structures of perovskites, are thus utilized as preferred substrates for the epitaxial growth of superconducting perovskite ceramic-oxide type films. However, because these perovskite substrates are very expensive and provide limited surface area upon which to deposit superconducting material, they have limited practical commercial importance.

Typically, non-epitaxially grown superconducting perovskite ceramic defect oxide-type films are polycrystalline in nature. That is to say that they are formed of individual superconducting grains columnarly arising from the underlying substrate. In prior work, efforts of the instant inventors at aligning these individual grains have resulted in spatial alignment only along the c-axis of the unit cells thereof (See commonly assigned U.S. patent application Ser. No. 442, 380 filed on Nov. 28, 1989, entitled "Method of Aligning Grains of a Multi-Grained Superconducting Material). While such c-axis alignment provided increased current flow as compared to randomly oriented superconducting material, it failed to provide the high current carrying capacity originally anticipated. The type of columnar growth present in typical polycrystalline superconducting material characterized by such c-axis orientation produces grain boundaries between individual grains. Current flowing along the a-b plane cannot travel very far before encountering the high angle grain boundaries separating adjacent crystallites, which effectively restrict current flow thereacross.

One of the instant inventors also previously disclosed $Y_1Ba_2Cu_3O_7$ superconducting films which were modified by the addition of a "parametric modifier" element to fill structural vacancies. (See commonly assigned U.S. patent application Ser. Nos. 043,279 filed Apr. 27, 1987, 444,487 filed Nov. 27, 1989 and 542,620 filed Jun. 22, 1990, entitled "Parametrically Modified Superconductor Material." The researchers at Energy Conversion Devices, Inc. realized that in order to achieve yet higher critical temperatures, it would be necessary to develop a superconducting material in which the chemistry thereof was engineered so as to alter the local chemical and electrical environment. For example, it has been established that the mobility of oxygen atoms in the $Y_1Ba_2Cu_3O_7$ ceramic based systems is very high and therefore the location of those mobile oxygen vacancies at any point in time contributes to the presence or absence of high $T_c$ superconducting phases. It is this oxygen mobility and changing local environment which results in the unstable electronic properties of this class of superconducting materials. Energy Conversion Devices, Inc., found that the addition of the very small and highly electronegative fluorine atoms effectively occupied lattice sites in the ceramic based fluoro-oxide class of superconducting materials so as to cause "grid lock" and provide an impediment to the mobility of oxygen atoms. The result was a stabilized high critical temperature superconducting material. Zero resistance evidence was provided of superconducting phases in parametrically "modified" materials as high as 155 to 168 Kelvin. The parametric modifier serves as a catalytic agent to promote grain alignment and to promote film growth along the a-b basal plane and inhibit c-axis growth.

The ability of high $T_c$ superconducting materials to carry high critical current densities is not only of great scientific importance but has immense economic significance. Initially, researchers were not sure of the current density carrying capabilities of the high critical temperature phases of these high $T_c$ superconducting materials. However, this doubt was resolved by scientists at various laboratories throughout the world who demonstrated experimentally that the high $T_c$ ceramic defect oxide superconducting materials could carry current densities exceeding $10^8$ amperes per square centimeter at 77K. This was determined by measuring the current density carried by either a single crystal or an epitaxially grown thin film of $Y_1Ba_2Cu_3O_7$ material in a direction parallel to the a-b plane, i.e., perpendicular to the c-axis of the unit cell thereof. However, the single crystal and the epitaxial thin films were found to be strongly anisotropic and could only carry about 10,000 amperes per square centimeter of current in a direction other than along said basal planes.

These experiments indicate that the high $T_c$ grains of the polycrystalline superconducting material are highly unaligned and the current density is limited by the high angle grain boundaries which result from columnar growth of the relatively small grains thereof. This is contrary to previous thinking to the effect that the alignment of the discrete grains of the polycrystalline superconducting material only along the c-axis, vis-a-vis, the basal plane, would be sufficient to produce materials having high current carrying capacities. It is now clear that alignment of the unit cells in the a-b direction as well as in the c-direction of the superconducting material is required in order to obtain an aligned current path and provide a superconducting material capable of carrying high current densities.

The extremely anisotropic nature of the high critical temperature superconducting materials, where the current flows preferentially along the Cu-O plane, and the strong chemical reactivity of the material have been the major stumbling blocks in the commercial development of high $T_c$ superconducting materials. It is clear that, randomly oriented polycrystalline film, tape or wire cannot be utilized to carry the high current densities necessary for most commercial applications. Up to now, the high current carrying capability of the high $T_c$ superconducting materials has only been demonstrated with tiny single crystals or on films epitaxially grown on perovskite substrates of the type characterized by a lattice mismatch of less than 2%, such as $SrTiO_3$, $LaAlO_3$, $LaGaO_3$, etc. However, these substrates are too costly for use in the fabrication of commercial devices, are available only in small wafers, and/or possess high dielectric constants and high dielectric losses. Further, such free standing single crystal superconducting materials are many times too small, inherently brittle and inflexible to be of commercial significance.

Accordingly, flexible, "epitaxial-like" films grown on electronic quality, inexpensive substrates must be utilized in order to make it commercially feasible to fabricate wire or other flexible superconducting material. Further, in numerous commercial applications, it is necessary that the superconducting material be grown on top of a metallic, highly conductive substrate, such as copper, silver or gold, to avoid a catastrophic failure in the event the superconducting material reverts back to its normal state.

Therefore, an urgent and long felt need exists for a method of growing single crystal, "epitaxial-like" thin films of flexible, high $T_c$, superconducting material on inexpensive non-perovskite substrates, such as glass, metals, synthetic polymers and the like. This need is particularly great if those superconducting films are to be capable of (1) providing high current carrying capacities and (2) being grown in an inexpensive, roll-to-roll, mass production process. It is to satisfy these crucial and long felt needs that the instant invention is directed.

It is to be understood that in superconducting materials of the type discussed herein a phenomenon termed "A-B twinning" frequently occurs. In materials of this type, the a and b crystalline axes are quite similar in physical properties; consequently they can substitute for one another in a crystal and this crystal is termed "twinned." Twinning does not adversely affect the properties of the superconducting material and as used herein, the term "single crystalline" includes twinned materials. It is also to be noted that superconducting materials typically exhibit superconductivity at low temperatures; thus a "superconducting material" can only exist, in a literal sense, at temperatures below the $T_c$ of that material. Nonetheless, the term "superconducting material" as used herein includes those materials which can manifest a superconducting effect even when they are above their Tc and hence not really superconducting.

SUMMARY OF THE INVENTION

A new approach to forming high quality thin superconducting film on a commercially viable basis is disclosed herein. It is crucial for the deposition of device quality, epitaxial-like, high $T_c$ superconducting films on inexpensive substrates, to grow the superconducting film with unit cell alignment so that the current can flow with minimal interference from weak links due to high angle grain boundaries typically present in prior art columnar, polycrystalline films.

The present invention provides a method of growing an epitaxial-like single crystal superconducting material which method promotes the epitaxial-like growth of the material at a selected one of the nucleation sites on a given substrate in deference to substantially all other nucleation sites on the substrate. Vapor phase deposition apparatus, such as laser ablation apparatus, is used to deposit film material on the substrate. The present invention methodology contemplates the initial exposure of only a single nucleation site located on the substrate to the deposition apparatus so as to grow a single crystal film at that site. The deposition process thereafter builds on the film initially deposited in deference to growth at all other potential nucleation sites thus inhibiting polycrystalline growth.

Deposition is controlled through the use of a mask to initially expose only the preselected nucleation site. During the operation of the deposition apparatus, either the mask is moved or the relationship between the mask, substrate and deposition apparatus is otherwise manipulated so as to vary the area of the substrate exposed to the deposition apparatus. The use of the mask inhibits polycrystalline growth of superconducting material, i.e. growth from numerous nucleation sites, during the operation of the deposition apparatus. Film grows in an "epitaxial-like" manner from the initial nucleation site and continues to grow as an increasing area of the substrate is exposed despite other potential nucleation sites thereafter encountered.

In one disclosed embodiment, the mask is positioned over the substrate and includes an adjustable aperture, which may be manipulated during the operation of the deposition apparatus so as to increase its diameter. Initially, the aperture has a small diameter and is positioned to correspond with the selected nucleation site. During the deposition process, the aperture opens, i.e., increases in diameter, to systematically expose more substrate surface to the deposition apparatus. Thus, additional substrate area is exposed to the deposition apparatus during the operation of the apparatus.

In another disclosed embodiment, the step of promoting the epitaxial-like growth of one of the nucleation sites includes manipulating the relative distance between the substrate and the mask during the operation of the deposition apparatus so as to increase the area of the substrate exposed to the deposition apparatus. "Epitaxial-like" growth of the superconducting material is thereby promoted during the operation of the deposition apparatus. When deposition processes which disperse the vapor deposition material are used, relative movement between the mask, having either a fixed or adjustable aperture, and the substrate can expose increased substrate surface areas to deposition apparatus. Thus, in certain situations the mask may be moved relative the substrate, or the substrate may be moved relative the mask to achieve the present "epitaxial-like" growth.

In some instances the substrate will have a plurality of nucleation sites thereon. Many metals, ceramics, polymers, glasses or other inexpensive substrates, typically have surface irregularities that operate as nucleation sites for superconducting material during a vapor phase deposition process. One of these integral nucleation sites may be selected for use in the present process. Alternatively, at least one separate nucleation site may be disposed at a known location on a substrate to operate as the selected nucleation site. Typically, the separate nucleation site is formed of the same or similar material as the superconducting material being deposited thereon, such as YBaCuO or $CaTiO_3$ material.

The disclosed apparatus for depositing a superconducting material on a substrate includes a holder for positioning the substrate within a deposition chamber and a source of vapor phase material having at least one superconducting phase. The source of the material is operative to direct the vapor phase material toward the substrate. Further, the apparatus includes means for exposing an initial, nucleus including, portion of the substrate to the source of vapor phase material and for blocking the remaining portion of the substrate from the source of vapor phase material. Lastly, the apparatus includes means for systematically varying the portion of the substrate exposed to the source of vapor phase material so as to inhibit polycrystalline growth of the superconducting material during the operation of the apparatus.

BRIEF DESCRIPTION OF THE DRAWINGS

These and other objects and aspects of the invention will become apparent in the detailed description of the invention hereinafter with respect to the drawings in which.

DETAILED DESCRIPTION OF THE PREFERRED EMBODIMENT

Figure 1:
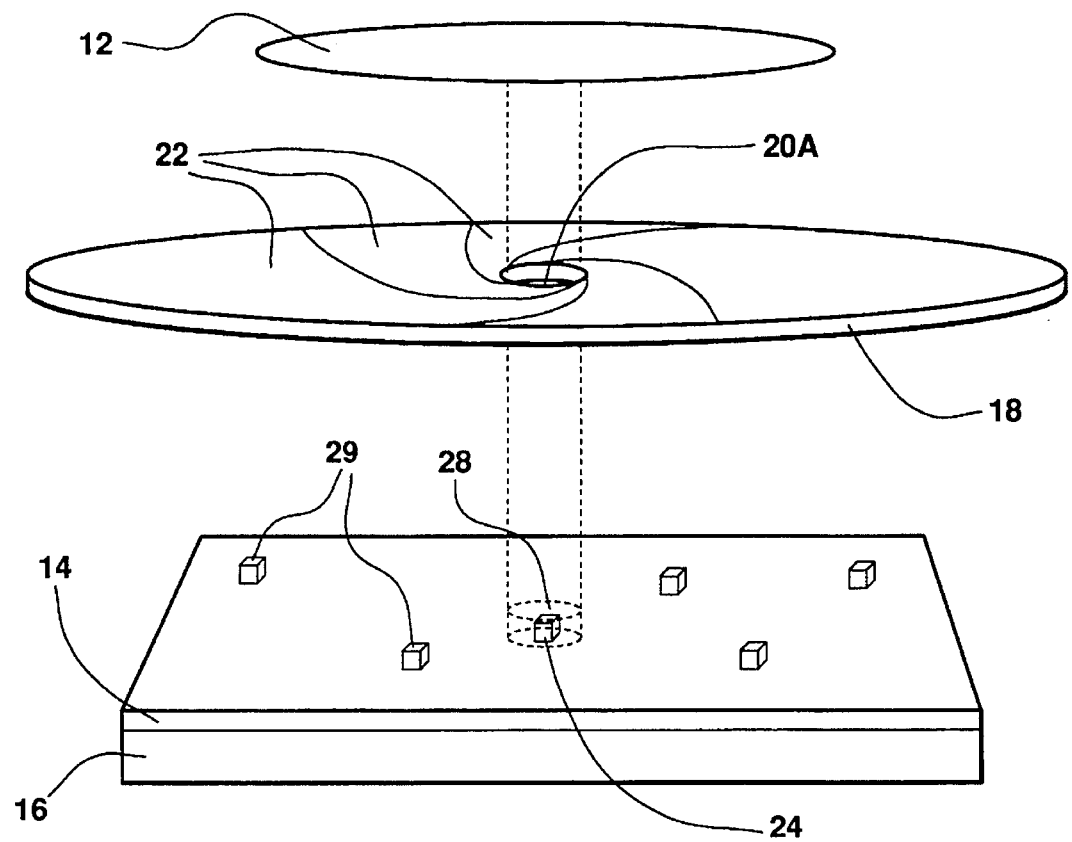
FIG. 1 is a perspective view of one embodiment of apparatus in accordance with the invention, shown in relation to a section of substrate.

In general, the present invention provides a method for depositing a single crystalline material body including the step of isolating a section of a target substrate containing a single nucleation site from the remainder substrate which may contain other nucleation sites. After so isolating the area containing the single nucleation site, the present invention promotes the "epitaxial-like" growth of material therefrom by exposing the isolated section of the substrate to vapor phase deposition apparatus. After initiating this "epitaxial-like" growth, the area of the isolated section of the substrate is varied so as to systematically expose a further area to the deposition apparatus and produce a large area film on the substrate. The film grows from the initial nucleation site and encounters other nucleation sites which may be present on the substrate before full independent crystal growth at these other nucleation sites can occur. Thus, the present invention produces a single crystal, epitaxial-like thin film on an inexpensive substrate.

While the following discussion will be generally in terms of the preparation of superconducting films, it is to be understood that the invention may be readily adapted for the preparation of films of any type of single crystal material. For example, the invention may be used to deposit a single crystal semiconductor material on a variety of substrates and this semiconductor film may be subsequently grown to greater thicknesses by conventional epitaxial processes. Similarly, the invention may be used to grow a single crystalline coating (e.g. calcium titanate) on a relatively low cost substrate (e.g. glass or steel). The coated substrate may then be used in a manner similar to high cost, bulk single-crystal substrates. A particularly preferred metal substrate is silver, such as single crystal silver.

Nucleation sites may be directly selected by locating an integrally formed nucleation site by operation of a microscope or other analytic devices. In other instances, a nucleation site may be provided by scratching, etching or otherwise mechanically deforming a portion of the substrate. Alternatively, a separate seed nucleation site may be directly deposited at a known location on the substrate to operate as the selected nucleation site. Typically, this separate seed nucleation site is formed of the same or similar material as the superconducting film being deposited thereon or from a material known to nucleate crystal growth of that material. For example, for YBaCuO superconducting films the seed site would be formed of YBaCuO material, or a structurally similar material such as $CaTiO_3$, $YAlO_3$, etc.

Additionally, an integrally formed nucleation site on a substrate which is known to include a number of sites, may be statistically selected by determining the area on the substrate which should contain one nucleation site based on an analysis of the substrate material utilized. By isolating an area on the substrate of equivalent size to the statistically determined area, a single nucleation site should thereby be selected.

It is envisioned that a substrate could be prepared so as to remove a substantial number of nucleation sites while retaining an area having at least one nucleation site intact. For example, a portion of a substrate can be protected during an ion bombardment operation adapted to obliterate any nucleation sites thereon. The protected area would retain its nucleation sites from which a film could be grown so as to cover the treated, nucleation site free, substrate.

Figure 2:
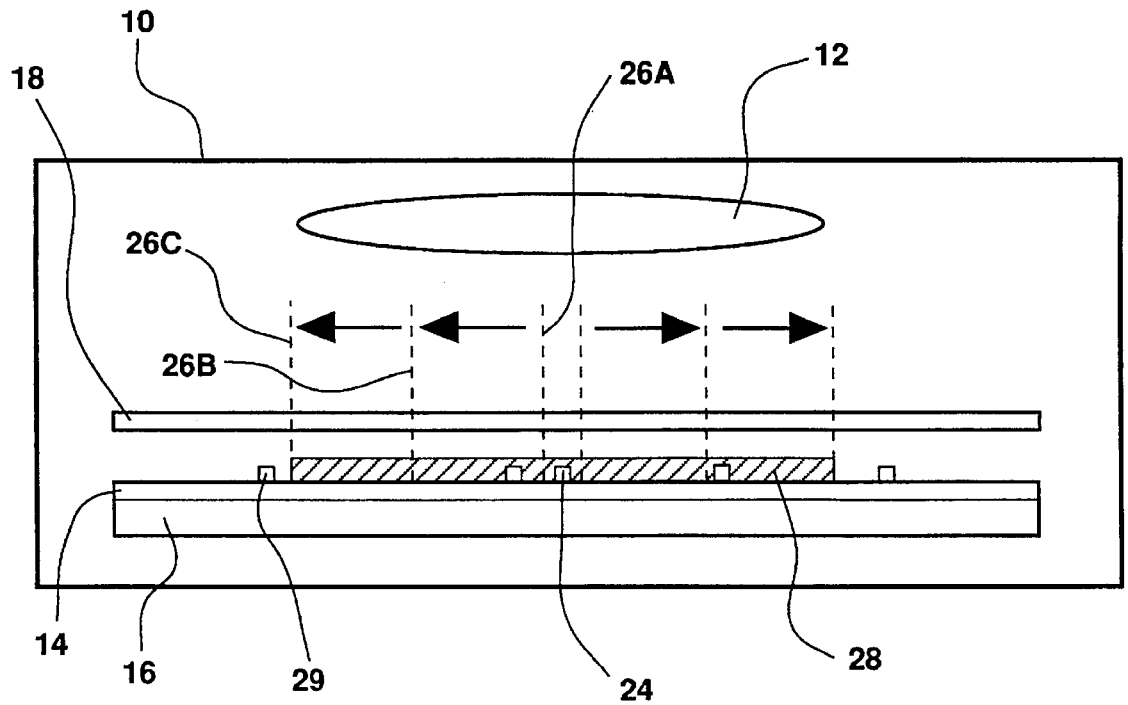
FIG. 2 is a cross-sectional, schematic diagram of the embodiment of FIG. 1, illustrating the operation of the adjustable aperture thereon.

With reference to FIGS. 1 and 2, the vapor phase deposition apparatus of the present invention typically includes an enclosure (shown in FIG. 2 generically as 10) such as a deposition chamber (not shown) which houses a source 12 of vapor phase material. The source 12 directs vapor phase material toward a substrate 14 disposed on a holder 16 within the enclosure 10. Preferably, the source 12 of vapor phase material comprises laser ablation apparatus which produces a laser beam to ablate the surface of a target pellet to produce vapor phase material as is known in the industry. Any other apparatus which produces vapor phase material, such as apparatus using sputtering or vacuum evaporation techniques, may alternatively be used in the present invention herein.

A mask 18 containing an aperture 20 is positioned over the substrate 14 so as to initially block a substantial portion of the substrate from the source 12 of vapor phase material. The mask further initially exposes the portion of the substrate containing the selected nucleation site 24 as defined by the aperture 20 to the source 12 of vapor phase material. Thus, the size and shape of aperture 20 in mask 18 depends upon the position of the mask relative to the substrate and the area of the substrate 14 to initially be exposed.

In one embodiment, the mask 18 includes an adjustable aperture 20A formed by moveable sections 22 which define the aperture 20A by the relative position of the sections 22 with respect to one another. For example, as the sections 22 retract away from the center of the mask 18, the diameter of the aperture 20A increases correspondingly.

The adjustable aperture 20A allows for "epitaxial-like" growth of the resulting superconducting film in a plurality of directions from the selected nucleation site 24 on the substrate 14. As can be seen in FIG. 2, during the operation of the apparatus, the adjustable aperture 20A increases in diameter (such as from edge positions 26A to 26B to 26C) to systematically expose larger areas of the substrate 14. In so doing, a superconducting film 28 of like area is produced by growth in a plurality of directions from the selected nucleation site 24 so as to cover substantially the same area on the substrate 14 as the area defined by the fully opened adjustable aperture 20A. In this manner, a single crystal film 28 is grown from the selected nucleation site 24 over other potential nucleation sites 29, in a manner analogous to the pulling of crystal boules from a melt.

Figure 3:
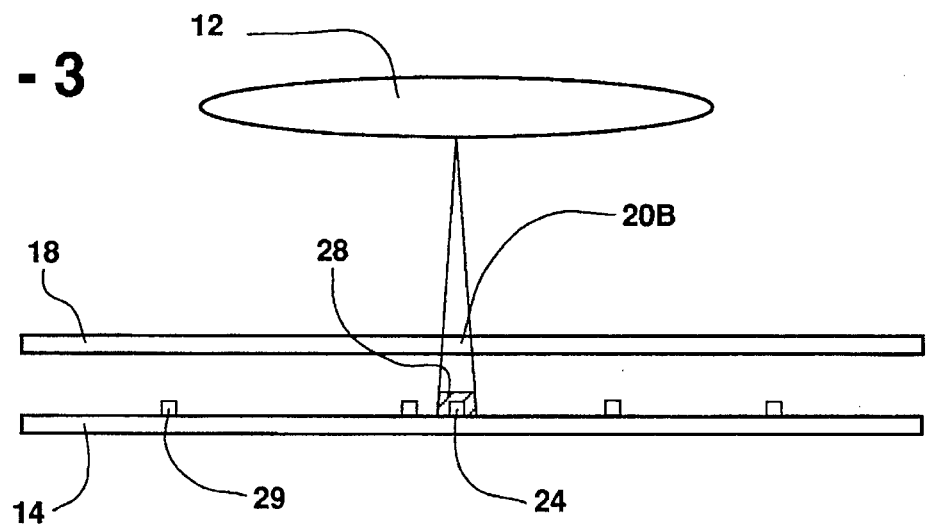
FIG. 3 is a cross-sectional schematic diagram of another embodiment of apparatus of the invention, shown in relation to a section of substrate.
Figure 4:
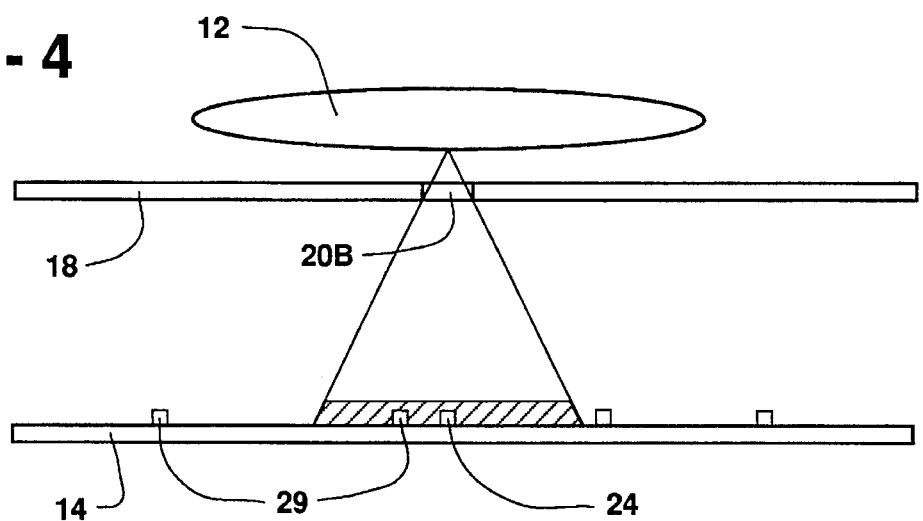
FIG. 4 is a cross-sectional schematic diagram of an apparatus similar to that of FIG. 3, illustrating the result of relative movement between of mask and the substrate in a direction generally perpendicular to the surface of the substrate.
Figure 5:
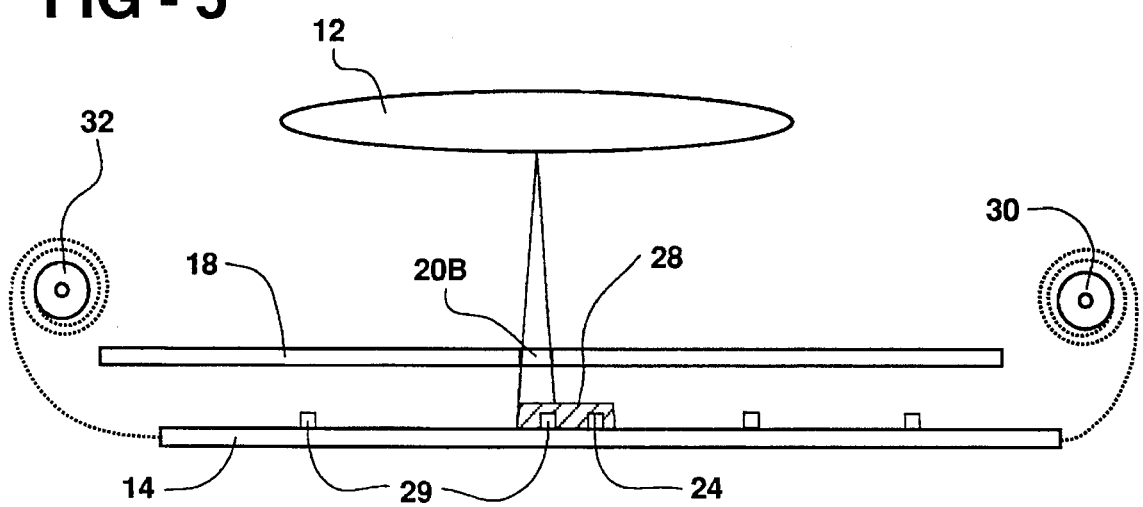
FIG. 5 is a cross-sectional schematic diagram of an apparatus similar to that of FIG. 3, illustrating the result of relative movement of the mask and the substrate in a direction generally parallel to the surface of the substrate.

With reference to FIGS. 3–5, another embodiment of the present invention utilizes a mask 18 having a fixed aperture 20B to deposit a superconducting film 28 on a substrate 24. To increase the area of the substrate 14 exposed to the deposition apparatus, the spatial relationship between the mask 18 having the fixed aperture 20B and the substrate 14 in relation to the overall structure must be manipulated.

For example, the area exposed can be changed by altering the relative position of the mask 18 between the source 12 and the substrate 14 in a direction perpendicular to the surface of the substrate being exposed. By positioning the mask 18 relatively close to the substrate 14 (as shown in FIG. 3), a small area of the substrate 14 is exposed. By coordinating the proximity of the mask 18 to the substrate 14 with the size of fixed aperture 20B, a single nucleation site 24 can thereby be selected for initial growth. Further, by increasing the distance between the mask 18 and the substrate 14, i.e., positioning the mask in closer proximity to the source 12, the area exposed to the deposition apparatus is increased.

Alternatively, the relative positions of the mask 18 and substrate 14 can be altered in a direction parallel to the surface of the substrate 14 being exposed to the deposition apparatus. As shown in FIG. 5, by moving either the mask 18 or substrate 14 in a direction substantially parallel to the surface of the substrate being exposed, a single crystal film 28 can be grown along the substrate 14. Thus, the present invention allows for the substrate 14 to comprise wire or thin bands amenable to roll-to-roll processing. An example of such processing includes the substrate 14 extended by dotted lines in FIG. 5 so as to wound from feed spool 32 to take up spool 30.

Further, by using a combination of relative movements of the components of the present apparatus, or a combination of the adjustable aperture 20A and one or more of the previously described relative movements, a superconductive film 28 of any desired configuration can be produced. At the same time, the resulting film 28 is formed as a single crystal, epitaxial-like thin film of flexible superconducting material on inexpensive non-perovskite substrates. In this manner, superconducting circuit lines, single crystal substrates, semiconductor films, and the like may be formed. As noted hereinabove, the present invention may also be employed to prepare high quality, low cost substrates and to prepare various semiconductor layers.

From the foregoing description of the preferred embodiment it can be seen that various alternative embodiments of the invention can be anticipated without departure from the scope of the invention as defined in the following claims.

We claim:

1. A method of growing a unit-cell-basal-plane-aligned, single crystal, superconducting material on non-perovskite substrates, said method including the steps of:

providing a non-perovskite substrate selected from the group consisting of metals, ceramics, polymers and glasses, said substrate including at least one nucleation site for initiating unit-cell-basal-plane-aligned, single crystal growth of superconducting material therefrom;

vapor phase depositing superconducting material onto said non-perovskite substrate;

promoting the unit-cell-basal-plane-aligned, single crystal growth of said superconducting material at one of said at least one nucleation sites in deference to all other nucleation sites on said non-perovskite substrate, whereby polycrystalline growth of said superconducting material is inhibited during the vapor phase deposition of said superconducting material.

2. The method of claim 1, wherein the step of providing a non-perovskite substrate comprises the step of providing a non-perovskite substrate formed of silver.

3. The method of claim 1, wherein the step of providing a non-perovskite substrate comprises the step of providing a non-perovskite substrate formed of single crystal silver.

4. The method of claim 1, wherein the step of providing a non-perovskite substrate comprises the step of providing a non-perovskite substrate having a plurality of nucleation sites thereon.

5. The method of claim 1, wherein the step of promoting unit-cell-basal-plane-aligned, single crystal growth of said superconducting mate one of said nucleation sites comprises the step of providing a mask over said substrate, said mask disposed so as to expose an area of said substrate containing one of said nucleation sites to the vapor phase deposition and to block substantially all other nucleation sites from said vapor phase deposition.

6. The method of claim 5, wherein the step of promoting the unit-cell-basal-plane-aligned, single crystal growth of said superconducting material at one of said nucleation sites comprises the step of manipulating said mask during said vapor phase deposition so as to increase the area of said non-perovskite substrate which is exposed to said vapor phase deposition to promote unit-cell-basal-plane-aligned, single crystal growth of the superconducting material during said vapor phase deposition.

7. The method of claim 6, wherein said step of providing a mask over said non-perovskite substrate comprises the step of providing a mask having an adjustable aperture; and said step of manipulating said mask during said vapor phase deposition comprises the step of increasing the size of the aperture of said mask during said vapor phase deposition.

8. The method of claim 5, wherein the step of promoting the unit-cell-basal-plane-aligned, single crystal growth of said superconducting at one of said nucleation sites further comprises the step of providing for relative movement between said non-perovskite substrate and said mask during said vapor phase deposition so as to expose further portions of said substrate to said vapor phase deposition.

9. The method of claim 8, wherein the step of providing for relative movement between said mask and said non-perovskite substrate includes the step of providing for such relative movement in a direction substantially perpendicular to the surface of the substrate exposed to said vapor phase deposition.

10. The method of claim 8, wherein the step of providing for relative movement between said mask and said non-perovskite substrate includes the step of providing for such relative movement in a direction substantially parallel to the surface of the substrate exposed to said vapor phase deposition.

11. The method of claim 8, wherein the step of providing for relative movement between said non-perovskite substrate and said mask comprises moving said substrate in relation to said mask.

12. The method of claim 8, wherein the step of providing for relative movement between said non-perovskite substrate and said mask comprises moving said mask in relation to said substrate.

13. The method of claim 1, wherein said step of vapor phase depositing superconducting material onto said non-perovskite substrate comprises the step of laser ablation depositing said superconducting material.

14. The method of claim 1, wherein the step of providing a non-perovskite substrate comprises providing a non-perovskite substrate having at least one integrally formed nucleation site thereon.

15. The method of claim 1, wherein the step of providing a non-perovskite substrate comprises the steps of:

providing at least one separate nucleation site; and disposing said at least one nucleation site on said substrate.

16. The method of claim 15, wherein the step of providing at least one separate nucleation site comprises the step of providing at least one nucleation site formed of a YBaCuO material.

17. A method of growing a unit-cell-basal-plane-aligned single crystal material, said method including the steps of:

providing a non-perovskite substrate selected from the group consisting of metals, ceramics, polymers and glasses, said substrate having a nucleation site thereon for initiating the crystal growth of said material;

vapor phase depositing said material onto said non-perovskite substrate;

providing a mask over said non-perovskite substrate, said mask disposed so as to initially expose said nucleation site to the vapor phase deposition and to block substantially all of the remaining portion of said substrate from said vapor phase deposition; and manipulating the relationship between said mask, and said non-perovskite substrate during said vapor phase deposition so as to vary the area of said non-perovskite substrate exposed to said vapor phase deposition, whereby single crystalline material is grown on said non-perovskite substrate and polycrystalline growth of said material is inhibited during said vapor phase deposition.

18. The method of claim 17, wherein the step of providing a non-perovskite substrate comprises the step of providing a non-perovskite substrate formed of silver.

19. The method of claim 17, wherein the step of providing a non-perovskite substrate comprises the step of providing a non-perovskite substrate formed of single crystal silver.

20. The method of claim 17, wherein said step of providing a mask over said non-perovskite substrate comprises the step of providing a mask having an adjustable aperture; and said step of manipulating the relationship between said mask, and said non-perovskite substrate during said vapor phase deposition comprises the step of increasing the diameter of the aperture of said mask during said vapor phase deposition so as to expose an increased area of said non-perovskite substrate to said vapor phase deposition.

21. The method of claim 17, wherein the step of manipulating the relationship between said mask, and said non-perovskite substrate during said vapor phase deposition comprises the step of providing for relative movement between said mask and said non-perovskite substrate.

22. The method of claim 21, wherein the step of providing for relative movement between said mask and said non-perovskite substrate includes the step of providing for such relative movement in a direction substantially perpendicular to the surface of the non-perovskite substrate exposed to said vapor phase deposition.

23. The method of claim 21, wherein the step of providing for relative movement between said mask and said non-perovskite substrate includes the step of providing for such relative movement in a direction substantially parallel to the surface of the non-perovskite substrate exposed to said vapor phase deposition.

24. The method of claim 17, wherein said step of vapor phase depositing superconducting material onto said non-perovskite substrate comprises the step of laser ablation depositing said superconducting material.

25. A method of growing a unit-cell-basal-plane-aligned single crystal, superconducting material, said method including the steps of:

providing a non-perovskite substrate selected from the group consisting of metals, ceramics, polymers and glasses, said non-perovskite substrate including at least one nucleation site for initiating the unit-cell-basal-plane-aligned, single crystal growth of the superconducting material;

vapor phase depositing superconducting material onto said non-perovskite substrate;

utilizing fluorine in the vapor phase deposition so as to promote the unit-cell-basal-plane-aligned, single crystal growth of a fluorinated superconducting material at one of said at least one nucleation site in deference to substantially all other nucleation sites on said non-perovskite substrate, whereby polycrystalline growth of the superconducting material is inhibited during the vapor phase deposition.

26. The method of claim 25, wherein the step of providing a non-perovskite substrate comprises providing a substrate formed of silver.

27. The method of claim 25, wherein said step of promoting the unit-cell-basal-plane-aligned, single crystal growth of said superconducting material comprises the step of promoting the growth of a fluorinated YBaCuO superconducting film.

28. The method of claim 25, wherein said step of promoting the unit-cell-basal-plane-aligned, single crystal growth of said superconducting material at one of said at least one nucleation site comprises the further step of providing a mask over said non-perovskite substrate, said mask operatively disposed so as to expose an area of said non-perovskite substrate containing one of said at least one nucleation site to said vapor phase deposition and to substantially shield the remaining portions of said substrate containing substantially all other nucleation sites from said vapor phase deposition.

29. The method of claim 28, wherein the step of promoting the unit-cell-basal-plane-aligned, single crystal growth of said superconducting material at one of said at least one nucleation site further comprises the step of manipulating said mask during said vapor phase deposition so as to increase the area of said non-perovskite substrate exposed to said vapor phase deposition to promote unit-cell-basal-plane-aligned, single crystal growth of the superconducting material during said vapor phase deposition.

30. The method of claim 29, wherein said step of providing a mask over said non-perovskite substrate comprises the additional step of providing a mask having an adjustable aperture; and said step of manipulating said mask during said vapor phase deposition comprises the step of increasing the size of the aperture of said mask during said vapor phase deposition.

31. The method of claim 28 wherein the step of promoting the unit-cell-basal-plane-aligned, single crystal growth of said superconducting material at one of said nucleation sites further comprises the step of providing for relative movement between said non-perovskite substrate and said mask during said vapor phase deposition so as to expose further portions of said substrate to said vapor phase deposition.

32. The method of claim 31, wherein the step of providing for relative movement between said mask and said non-perovskite substrate includes the step of providing for said relative movement in a direction substantially perpendicular to the surface of the substrate exposed to said vapor phase deposition.

33. The method of claim 31, wherein the step of providing for relative movement between said mask and said non-perovskite substrate includes the step of providing for such relative movement in a direction substantially parallel to the surface of the substrate exposed to said vapor phase deposition.

34. The method of claim 25, wherein said step of vapor phase depositing superconducting material onto said non-perovskite substrate comprises the step of laser ablation depositing said superconducting material.

* * * * *